(12) United States Patent
Gardner et al.

(10) Patent No.: US 6,258,675 B1
(45) Date of Patent: *Jul. 10, 2001

(54) HIGH K GATE ELECTRODE

(75) Inventors: Mark I. Gardner, Cedar Creek; H. James Fulford, Austin, both of TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/993,766

(22) Filed: Dec. 18, 1997

(51) Int. Cl.[7] .................................................. H01L 21/336
(52) U.S. Cl. ........................ 438/287; 257/411; 438/216; 438/591
(58) Field of Search ..................... 257/411, 41; 438/216, 438/585, 591, 595, 287

(56) References Cited

U.S. PATENT DOCUMENTS

| | | | |
|---|---|---|---|
| 4,777,517 | * | 10/1988 | Onodera et al. ........................ 357/22 |
| 4,791,471 | * | 12/1988 | Onodera et al. ........................ 357/60 |
| 4,889,817 | * | 12/1989 | Saito et al. ............................. 437/22 |
| 4,905,061 | * | 2/1990 | Ohmuro et al. ........................ 357/22 |
| 5,183,771 | * | 2/1993 | Mitsui et al. .......................... 257/344 |
| 5,225,286 | * | 7/1993 | Fujikawa et al. ..................... 428/426 |
| 5,243,202 | * | 9/1993 | Mori et al. ............................... 257/59 |
| 5,286,994 | * | 2/1994 | Ozawa et al. ......................... 257/411 |
| 5,292,673 | * | 3/1994 | Shinriki et al. ....................... 437/235 |
| 5,319,229 | * | 6/1994 | Shimoji et al. ....................... 257/324 |
| 5,528,068 | * | 6/1996 | Ohmi ..................................... 257/410 |
| 5,596,214 | * | 1/1997 | Endo ...................................... 257/325 |
| 5,619,051 | * | 4/1997 | Endo ...................................... 257/316 |
| 5,688,724 | | 11/1997 | Yoon et al. . |
| 5,866,473 | * | 2/1999 | Xiang et al. .......................... 438/585 |
| 5,880,508 | * | 3/1999 | Wu ......................................... 257/411 |
| 5,891,798 | * | 4/1999 | Doyle et al. .......................... 438/624 |

FOREIGN PATENT DOCUMENTS

| | | |
|---|---|---|
| 51-138950 | 6/1978 | (JP) . |
| 53-062987 | 6/1978 | (JP) . |
| 03162754 | 1/1993 | (JP) . |
| 05013756 | 1/1993 | (JP) . |

OTHER PUBLICATIONS

IBM Technical Disclosure Bulletin, vol. 14, No. 11, Apr. 1972.*

* cited by examiner

Primary Examiner—Charles Bowers
Assistant Examiner—Eric Kielin

(57) ABSTRACT

A semiconductor structure with a high-K insulative layer. An insulative layer is disposed on a silicon substrate and includes a first nitride layer and a high-K layer. A gate is disposed on the insulative layer. The insulative layer further includes sidewalls extending at least flush with corresponding sidewalls of the gate. Source and drain regions are disposed within the substrate adjacent to the insulative layer.

26 Claims, 3 Drawing Sheets

HIGH K GATE ELECTRODE

FIELD OF THE INVENTION

The present invention relates generally to integrated circuit manufacturing and more particularly to a gate electrode having a high K value.

BACKGROUND OF THE INVENTION

An insulated-gated field-effect transistor (IGFET), such as a metal-oxide semiconductor field-effect transistor (MOSFET), uses a gate to control an underlying surface channel joining a source and a drain. The channel, source and drain are located within a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

In typical IGFET processing, the source and the drain are formed by introducing dopants of a second conductivity type (P or N) into a semiconductor substrate of a first conductivity type (N or P) using a patterned gate as a mask. This self-aligning procedure tends to improve packing density and reduce parasitic overlap capacitances between the gate and the source and drain.

Polysilicon (also known as polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anistropically etched to provide a gate that provides a mask during formation of the source and drain by ion implantation. Thereafter, a drive-in step is applied to repair crystalline damage and to drive-in and activate the implanted dopant.

As IGFET dimensions are reduced and the supply voltage remains constant (e.g., 3 volts), the electric field in the channel near the drain tends to increase. If the electric field becomes strong enough, it can give rise to so-called hot-carrier effects. For example, hot electrons can overcome the potential energy barrier between the substrate and the gate insulator, causing hot carriers to become injected into the gate insulator. Trapped charge in the gate insulator due to injected hot carriers accumulates over time and can lead to a permanent change in the threshold voltage of the device. Hot carrier effects are also referred to as "bridging."

A number of techniques have been utilized to reduce hot carrier effects. One such technique is a lightly doped drain (LDD). An LDD reduces hot carrier effects by reducing the maximum lateral electric field. The drain is typically formed by two ion implants. A light implant is self-aligned to the gate, and a heavy implant is self-aligned to the gate on which sidewall spacers have been formed. The spacers are typically oxides or nitrides. The purpose of the lighter first dose is to form a lightly doped region of the drain (or LDD) at the edge near the channel. The second heavier dose forms a low resistivity heavily doped region of the drain, which is subsequently merged with the lightly doped region. Since the heavily doped region is further away from the channel than a conventional drain structure, the depth of the heavily doped region can be made somewhat greater without adversely affect the device characteristics. The lightly doped region is not necessary for the source—unless bidirectional current is used—however, lightly doped regions are typically formed for both the source and the drain to avoid additional processing steps.

The formation of spacers to ultimately create lightly doped regions, however, is disadvantageous in that it requires extra processing steps that may add cost, complexity and time to the formation of a transistor. In the process just described, for example, two extra processing steps are required: the formation of spacers, and the application of a second ion implantation. Thus, there is a need for the formation of transistors that either do not require lightly doped regions, but that have the same performance characteristics as lightly doped regions, or that provide for the formation of lightly doped regions in less than two ion implantations.

SUMMARY OF THE INVENTION

The above-mentioned shortcomings, disadvantages and problems are addressed by the present invention, which will be understood by reading and studying the following specification. The invention relates to a gate electrode having a high K value. In one embodiment, a method includes three steps. In the first step, a gate electrode layer is formed on a substrate. The gate electrode layer includes at least one layer, this layer having a high K value. In the second step, a gate is formed on the gate electrode layer. The gate masks a portion of the gate electrode layer. In the third step, the gate electrode layer is removed, except for the portion masked by the gate.

Because the gate is "stacked" on the gate electrode layer, the device formed pursuant to this embodiment of the invention is not susceptible to bridging and other hot carrier effects as are typical prior art devices that do not have lightly doped regions. That is, the raising of the gate height-wise vis-a-vis the top surface of the substrate in which source and drain regions are to be formed ensures that bridging will not occur, militating against the need for lightly doped regions. This is an advantage of the invention.

In a further embodiment of the invention, the side and top edges of the gate are oxidized and removed, decreasing the length of the gate. This decrease in the length of the gate further serves to prevent bridging and other hot carrier effects, by increasing the lateral distance between the gate and the source and drain regions. This is a further advantage of the invention.

The present invention describes methods, devices, and computerized systems of varying scope. In addition to the aspects and advantages of the present invention described here, further aspects and advantages of the invention will become apparent by reference to the drawings and by reading the detailed description that follows.

DETAILED DESCRIPTION OF THE INVENTION

In the following detailed description of exemplary embodiments of the invention, reference is made to the accompanying drawings which form a part hereof, and in which is shown by way of illustration specific exemplary embodiments in which the invention may be practiced. These embodiments are described in sufficient detail to enable those skilled in the art to practice the invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the appended claims.

Figure 1A:
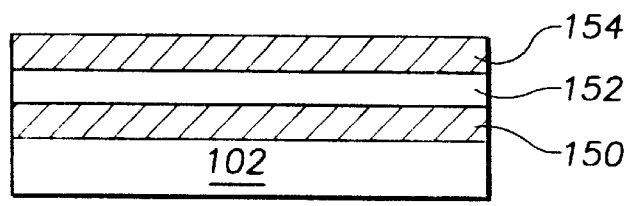
FIGS. 1A–1F show cross-sectional views of successive process steps for making an IGFET, in accordance with one embodiment of the invention; and, FIG. 2 is a diagram of a computerized system, in accordance with which the invention may be implemented.

In FIG. 1A, silicon substrate 102 suitable for integrated circuit manufacture includes P-type epitaxial layer with a boron background concentration on the order of $1 \times 10^{16}$ atoms/cm$^3$, a <100> orientation and a resistivity of 12 ohm-cm. Desirably, the epitaxial surface layer is disposed on a P+ base layer, not shown, and includes a planar top surface. Thereafter, a blanket layer of nitride 150, having a desirable thickness of 20–100 angstroms, a high-K layer 152, having a desirable thickness of 50–100 angstroms, and a second layer of nitride 154, having a desirable thickness of 20–100 angstroms, are deposited on the substrate 102. The layer 152 desirably has a K value of 8–1000, and may be formed from such materials as TiO$_2$ and Ta$_2$O$_5$. The layers 150, 152 and 154 make up a gate electrode layer.

Figure 1B:
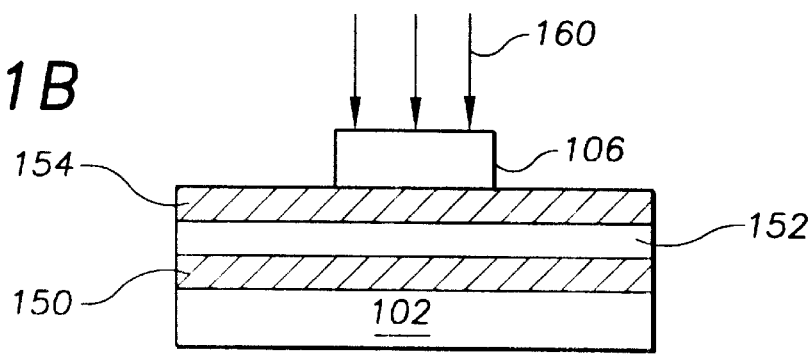

In FIG. 1B, a blanket layer of undoped polysilicon 106 is deposited by low pressure chemical vapor deposition (LPCVD) on the top nitrade layer 154. Polysilicon 106 has a thickness of 2000 angstroms, desirably. If also desired, polysilicon 106 can be doped in situ as deposition occurs, or doped before a subsequent etch step by implanting arsenic with a dosage in the range of $5 \times 10^{14}$ to $5 \times 10^{15}$ atoms/cm$^2$, and an energy in the range of 2 to 80 keV. However, it is generally desired that polysilicon 106 be doped during an implantation step following a subsequent etch step.

In FIG. 1B, the polysilicon 106 deposited on the substrate 102 is implanted with arsenic ions and then with nitrogen ions. The arsenic ions enhance the rate of silicon dioxide growth in subsequent oxidation processes used to add or grow an additional layer of silicon dioxide. The arsenic ion implant has a dosage in the range of $5 \times 10^{14}$ to $5 \times 10^{15}$ atoms/cm$^2$, and an energy level ranging between about 2 to 80 keV. Doping with nitrogen is optional. The nitrogen ions may be added to retard the diffusion of the arsenic atoms. If the polysilicon is to be doped with nitrogen ions, the polysilicon may be implanted at this point in the process at a dosage of $5 \times 10^{14}$ to $5 \times 10^{15}$ atoms/cm$^2$, and at an energy level of 20 to 200 keV. Nitrogen ions may be implanted after etching the polysilicon.

Photoresist, not shown in FIG. 1B, is deposited as a continuous layer on polysilicon 106 and selectively irradiated using a photolithographic system, such as a step and repeat optical projection system, in which I-line ultraviolet light from a mercury-vapor lamp is projected through a first reticle and a focusing lens to obtain a first image pattern. Thereafter, the photoresist is developed and the irradiated portions of the photoresist are removed to provide openings in the photoresist. The openings expose portions of polysilicon 106, thereby defining a gate.

Still referring to FIG. 1B, an anisotropic etch is applied that removes the exposed portions of polysilicon 106. Desirably, a first dry etch is applied that is highly selective of polysilicon, and a second dry etch is applied that is highly selective of silicon dioxide, using photoresist as an etch mask. After etching occurs, the remaining portion of polysilicon 106 provides a polysilicon gate 106 with opposing vertical sidewalls (or, edges), and a top edge. Polysilicon gate 106 has a length (between its sidewalls) of 500–2500 angstroms, desirably.

Figure 1C:
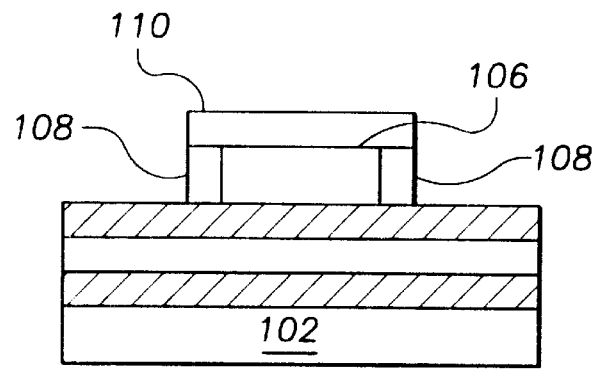

In FIG. 1C, the photoresist is stripped, and oxide layers 108 (side layers) and 110 (top layer), comprised of silicon dioxide, are formed on the exposed surfaces of gate 106 using oxide tube growth at a temperature of 700° C. to 1000° C., in an O$_2$ containing ambient. A typical oxidation tube contains several sets of electronically powered heating coils surrounding the tube, which is either quartz, silicon carbide, or silicon, desirably. In O$_2$ gas oxidation, the wafers are placed in the tube in a quartz "boat" or "elephant," and the gas flow is directed across the wafer surfaces to the opposite or exhaust end of the tube. Oxide layers 108 and 110 have a thickness of 30 angstroms, desirably. The oxidation as shown in FIG. 1C is optional, however.

Figure 1D:
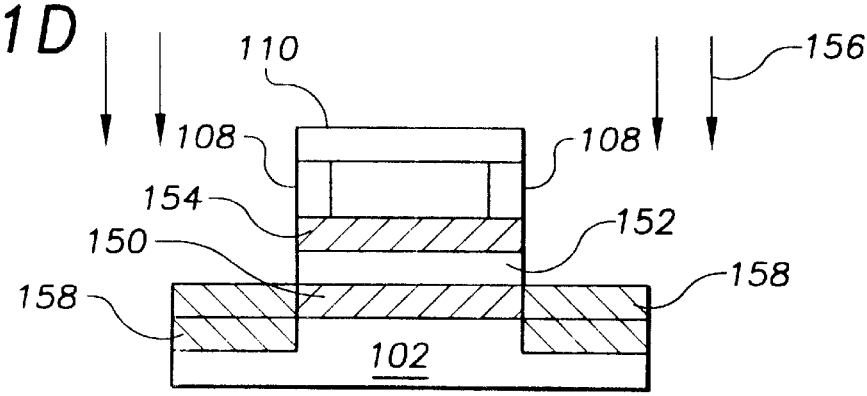

In FIG. 1D, the portions of layers 152 and 154 not masked by gate 106 (including oxide layers 108 and 110)—that is, not underneath gate 106—are removed, desirably by applying an etchant. The bottom nitride layer 150 desirably remains, however. Thereafter, an ion implantation, as represented by arrows 156, is applied, to create source and drain regions 158. The ion implantation may be an n-type dopant, such as arsenic, or a p-type dopant, such as boron, depending on whether a PMOSFET or an MOSFET is desired. Polysilicon gate 106 provides an implant mask for the underlying portion of substrate 102. Desirably, the implant has a dosage in the range of $5 \times 10^{14}$ to $5 \times 10^{15}$ atoms/cm$^2$, and an energy level ranging between about 2 to 80 keV.

Figure 1E:
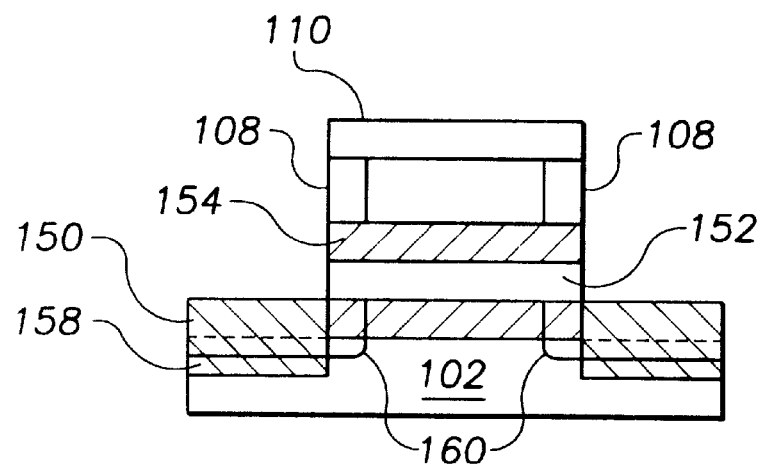

In FIG. 1E, an optional rapid thermal anneal (RTA) is performed. The RTA cures the ion implantation applied in the previous step, and also serves to create lightly doped regions 160, which further reduces the channel length underneath gate 106.

Figure 1F:
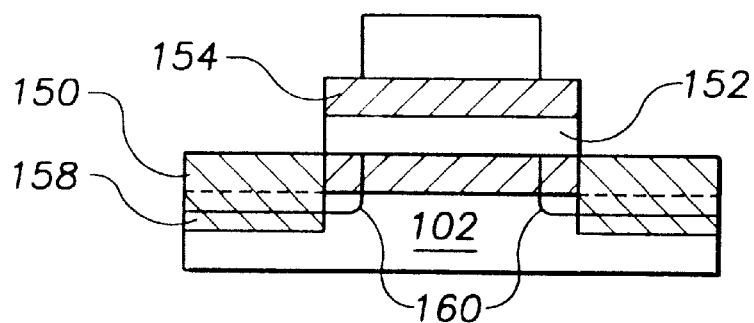

In FIG. 1F, another optional step is performed, the removal of oxide layers 108 and 110, desirably by etching. Prior to the removal of these oxide layers, the underlying gate electrode layer (made up of layers 150, 152 and 154) has sidewalls that are flush with the sidewalls of the gate, including the oxide layers. That is, the gate electrode layer has a length equal to the length of the gate. However, after removal of the oxide layers, the resulting gate has a lesser length than the length of the gate electrode layer. Put another way, the sidewalls of the gate electrode extend beyond the sidewalls of the gate. Not shown in FIG. 1F are the conventional processing steps of salicidation, placing glass over the surface, and forming a contact opening for subsequently placed connectors. A passivation layer may also then be deposited as a top surface. Additionally, the principal processing steps disclosed herein may be combined with other steps apparent and known to those skilled in the art.

The result of steps FIGS. 1A–1F is an IGFET that is not susceptible to bridging or other hot carrier effects. The gate electrode layer, including a layer having a high-K value, raises the gate sufficiently above the source and drain regions such that bridging does not occur. Furthermore, the reduction of the gate via formation of oxide layers at the edges of the gate, and the removal thereof, provides further protection against bridging. These are advantages of the invention.

Figure 2:
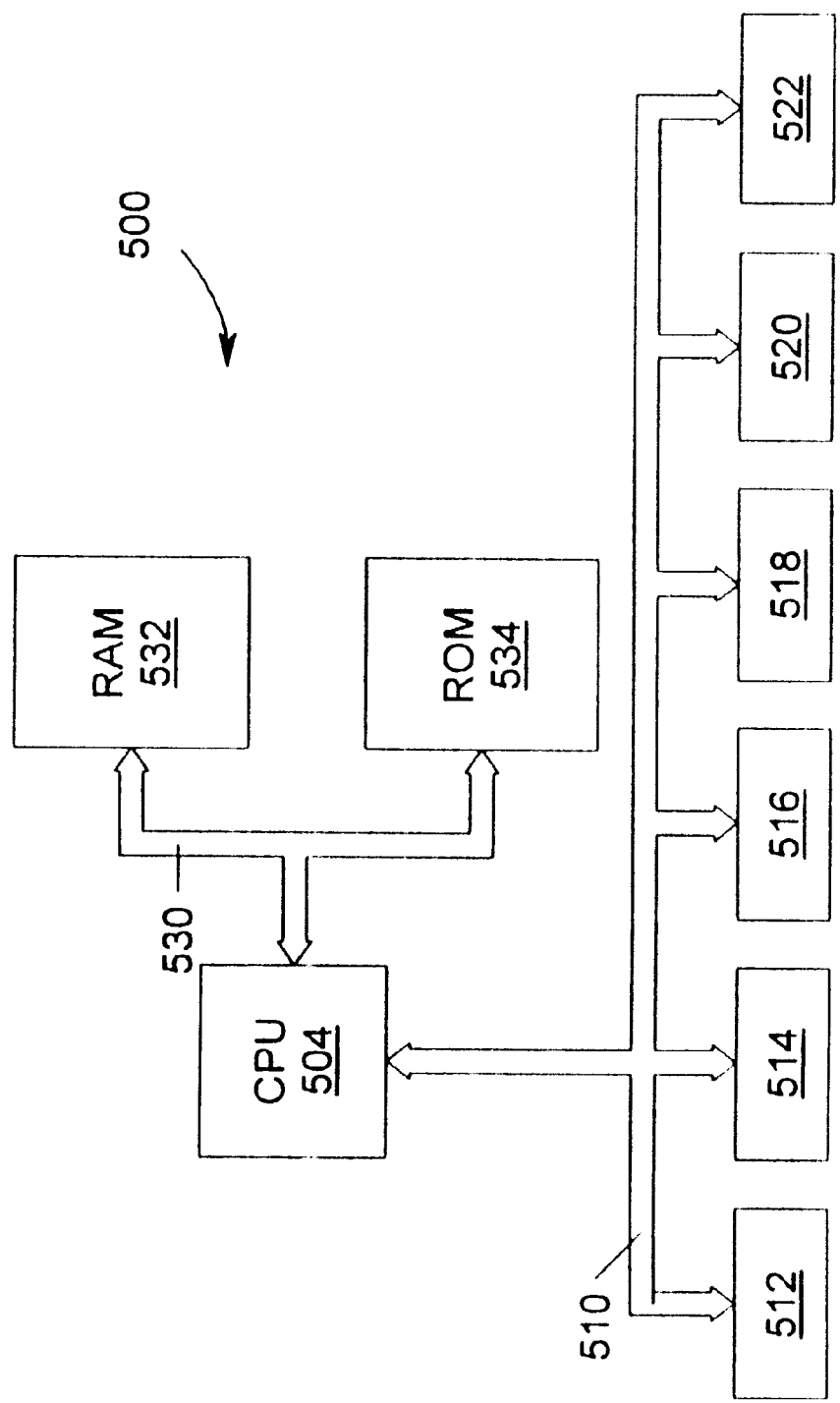

Referring next to FIG. 2, advantageously the invention is well-suited for use in a device such as an integrated circuit chip, as well as an electronic system including a central processing unit, a memory and a system bus. The electronic system may be a computerized system 500 as shown in FIG. 2. The system 500 includes a central processing unit 500, a random access memory 532, and a system bus 530 for communicatively coupling the central processing unit 504 and the random access memory 532. The system 500 includes a device formed by the steps shown in and described in conjunction with FIGS. 1A–1G. The system 500 may also include an input/output bus 510 and several peripheral devices, such as devices 512, 514, 516, 518, 520 and 522, which may be attached to the input/output bus 510. Peripheral devices may include hard disk drives, floppy disk drives, monitors, keyboards, and other such peripherals.

A gate electrode having a high K value has been described. Although specific embodiments have been illustrated and described herein, it will be appreciated by those of ordinary skill in the art that any arrangement which is calculated to achieve the same purpose may be substituted for the specific embodiments shown.

This application is intended to cover any adaptations or variations of the present invention. Therefore, it is manifestly intended that this invention be limited only by the following claims and equivalents thereof.

We claim:

1. A method for forming a semiconductor structure, comprising the steps of:
    forming an insulative layer on a substrate, the insulative layer composed of a first insulative layer disposed on the substrate, a second insulative layer having a high K value disposed on the first insulative layer and a third insulative layer disposed on the second insulative layer;
    forming a gate electrode structure on the insulative layer, the gate electrode structure composed of a gate electrode, having a top wall and side walls, and a plurality of insulative members disposed on the top wall and sidewalls of the gate electrode;
    masking a portion of the insulative layer with the gate electrode structure; and
    removing portions of the insulative layer such that the insulative layer has sidewalls that are flush with the sidewalls of the gate electrode.

2. The method of claim 1, wherein the step of forming the gate electrode structure includes the steps of:
    forming a polysilicon gate electrode;
    implanting arsenic ions in the polysilcon gate electrode; and
    oxidizing the gate electrode to form the insulative members at each of the edges of the gate.

3. The method of claim 2, wherein the step of oxidizing the gate electrode includes using oxide tube growth at 700–1000° C. in an oxygen ambient to form silicon dioxide insulative members having a thickness of about 30 angstroms.

4. The method of claim 3, further comprising the step of using the gate electrode structure to form lightly doped regions in the substrate and in between the vertical boundaries defining opposing edges of the gate electrode structure and the insulative layer, thereby reducing the channel length under the gate electrode structure.

5. The method of claim 4, wherein the step of using the gate electrode structure to form lightly doped regions includes the step of performing an ion implantation to form source and drain regions within the substrate with an implant energy level ranging from about 2 KeV to about 80 KeV.

6. The method of claim 5, further comprising the step of performing a rapid thermal anneal after the step of implanting ions in the semiconductor structure.

7. The method of claim 6, wherein the step of forming the insulative layer includes forming a first nitride layer on the substrate, forming a high-K layer on the first nitride layer and forming a second nitride layer on the high-K layer.

8. The method of claim 7, wherein the step of forming a high-K layer includes materials from the group consisting of titanium oxide and tantalum pentaoxide.

9. The method of claim 8, further comprising the step of forming a metal silicide in a portion of the first nitride layer adjacent to each side wall of the insulative layer.

10. The method of claim 1, wherein the step of forming the gate electrode structure include the steps of:
    forming a polysilicon gate electrode;
    implanting boron ions in the polysilcon gate electrode; and oxidizing the gate electrode to form the insulative members at each of the edges of the gate.

11. the method of claim 10, wherein the step of oxidizing the gate electrode includes using oxide tube growth at 700–1000° C. in an oxygen ambient to form silicon dioxide members having a thickness of about 30 angstroms.

12. The method of claim 11, further comprising the step of using the gate electrode structure to form lightly doped regions in the substrate and in between the vertical boundaries defining opposing edges of the gate electrode structure and the insulative layer, thereby reducing the channel length under the gate electrode structure.

13. The method of claim 12, wherein the step of using the gate electrode structure to form lightly doped regions includes the step of performing an ion implantation to form source and drain regions within the substrate with an implant energy level ranging from about 2 KeV to about 80 KeV.

14. The method of claim 13, wherein the step of forming the insulative layer includes forming a first nitride layer on the substrate, forming a high-K layer on the first nitride layer and forming a second nitride layer on the high-K layer.

15. The method of claim 14, wherein the step of forming a high-K layer includes materials from the group consisting of titanium oxide and tantalum pentaoxide.

16. The method of claim 15, further comprising the step of forming a metal silicide in a portion of the first nitride layer adjacent to each side wall of the insulative layer.

17. The method of claim 3, wherein the insulative members are formed having a substantially rectangular shape, the insulative members on the side walls of the gate electrode having a top surface parallel with the top wall of the gate electrode, thereby forming vertical sidewalls on the insulative layer flush with the gate electrode structure upon removal of portions of the insulative layer.

18. The method of claim 17, wherein the insulative member on the top wall of the gate electrode is substantially rectangular in shape and extends flush with the outer edges of the insulative members on the sidewalls of the gate electrode.

19. A method for forming a device comprising:

forming a gate electrode layer on a substrate, the gate electrode layer comprising at least one layer, one of the at least one layer having a high K value;

forming a gate on the gate electrode layer, the gate having two side edges and a top edge, and masking a portion of the gate electrode layer, oxidizing the gate to form an oxidation layer at each of the edges of the gate and then, removing the gate electrode layer except the portion of the gate electrode layer masked by the gate, and removing the oxidation layer at each of the edges of the gate.

20. The method of claim 19, further comprising performing an ion implantation to form source and drain regions within the substrate adjacent to the gate.

21. The method of claim 20, further comprising performing a rapid thermal anneal.

22. The method of claim 19, wherein removing the oxidation layer comprises etching the oxidation layer.

23. The method of claim 20, further comprising forming a metal silicide within the substrate adjacent to each side edge of the gate.

24. The method of claim 19, wherein removing the gate electrode layer comprises etching the gate electrode layer.

25. The method of claim 19, wherein the at least one layer includes a nitride layer below the layer having the high K value.

26. The method of claim 25, wherein the at least one layer includes a second nitride layer above the layer having the high K value.

* * * * *

UNITED STATES PATENT AND TRADEMARK OFFICE
CERTIFICATE OF CORRECTION

PATENT NO. : 6,258,675 B1
DATED : July 10, 2001
INVENTOR(S) : Gardner et al.

Page 1 of 1

It is certified that error appears in the above-identified patent and that said Letters Patent is hereby corrected as shown below:

<u>Title page,</u>
The second inventor's name should read -- H. Jim Fulford --.

<u>Column 3,</u>
Line 29, "top nitrade" should read -- nitride --.

<u>Column 6,</u>
Line 31, "the method", should read -- The method --.

Signed and Sealed this

Nineteenth Day of March, 2002

Attest:

JAMES E. ROGAN
*Director of the United States Patent and Trademark Office*

*Attesting Officer*